(12) United States Patent
Teshome et al.

(10) Patent No.: US 6,236,572 B1
(45) Date of Patent: May 22, 2001

(54) CONTROLLED IMPEDANCE BUS AND METHOD FOR A COMPUTER SYSTEM

(75) Inventors: Abeye Teshome; Douglas Elmer Wallace, Jr., both of Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/245,147

(22) Filed: Feb. 4, 1999

(51) Int. Cl.[7] .................................................. H05K 1/11
(52) U.S. Cl. .................. 361/794; 361/321.2; 29/852; 333/206; 174/261; 174/262
(58) Field of Search ............................ 361/321.2, 794; 430/5; 174/261, 262; 333/206, 1; 29/852

(56) References Cited

U.S. PATENT DOCUMENTS

| | | |
|---|---|---|
| 4,361,634 * | 11/1982 | Miller .................................. 430/5 |
| 5,150,088 | 9/1992 | Virga et al. . |
| 5,185,502 * | 2/1993 | Shepherd et al. ..................... 174/262 |
| 5,278,524 | 1/1994 | Mullen . |
| 5,677,515 | 10/1997 | Selk et al. . |
| 5,719,750 | 2/1998 | Iwane . |
| 6,072,690 * | 6/2000 | Farooq et al. ..................... 361/321.2 |

* cited by examiner

Primary Examiner—Jeffrey Gaffin
Assistant Examiner—Thanh Y. Tran
(74) Attorney, Agent, or Firm—Haynes and Boone, L.L.P.

(57) ABSTRACT

A multi-layer circuit substrate having an integral bus portion includes a dielectric substrate having a first device signal layer formed on a first side thereof and a second device signal layer formed on a second side thereof. The first and second device signal layers are each patterned to include at least one bus reference plane. A device reference plane layer is disposed between the first and second device signal layers in the dielectric substrate. The device reference plane layer is patterned to include a plurality of guard bands and a bus signal trace between at least two of the guard bands.

33 Claims, 4 Drawing Sheets

CONTROLLED IMPEDANCE BUS AND METHOD FOR A COMPUTER SYSTEM

BACKGROUND

The disclosures herein relate generally to printed circuit boards (PCB's) and methods for manufacturing printed circuit boards. More particularly, the disclosures herein relate to printed circuit boards for use in a computer system having at least one bus exhibiting controlled impedance characteristics.

Plug-in memory modules are commonly used in personal computers (PC's). These modules connect to the motherboard of a PC through an electrical connector that is mounted on the motherboard, allowing additional memory and memory with improved performance to be installed. RAMBUS™ Incorporated offers a line of high-performance memory modules called RAMBUS In-Line Memory Modules, also known as RIMM™ modules. The RIMM modules are based on the electrical requirements of a technology known as the Direct RAMBUS Channel. This technology is a high-speed bus operating at clock speeds of 400 MHz or more, enabling data rates of 800 bps or more. To maintain high signal integrity, the bus uses transmission line characteristics. Of these characteristics, controlled impedance is key.

The use of RAMBUS RIMM modules requires that the interface between the memory and the memory controller have a nominal impedance of 28 ohms with a maximum tolerance of +/−20%. In cases where RAMBUS memory and the memory controller are mounted on the same PCB, a PCB having a tolerance of +/−20% is acceptable. However, in the case of a RIMM module, where the memory and memory controller reside on separate PCB's, the PCB's used for the RIMM module as well as the motherboard must have an impedance of 28 ohms with a maximum tolerance of +/−2.8 ohms (+/−10%). This specification ensures that the combined tolerance of the RIMM module and the memory controller PCB is not more than +/−20%.

This impedance specification is tighter than the present capability of PCB manufacturers. The geometric variations of the dielectric thickness and trace widths at the current limits of PCB manufacturability will provide 28 ohms with a tolerance of +/−4.8 ohms (+/−20%). Empirical data shows that vendors can, with an extra degree of care, reach a tolerance of +/−3.44 ohms. Even then, testing is still required to select the PCB's that satisfy the required tolerance for RAMBUS memory. Therefore, PCB's for use with high performance memory such as RAMBUS RIMM Modules currently have to be 100% tested, at least for initial production boards. This increases the cost of the PCB's for these types of applications and results in increased yield loss. Consequently, the cost of the devices and machines in which these boards and RAMBUS memory are used is also increased.

Current bus construction techniques for 4 layer PCBs provide a one-sided dielectric and bus reference plane configuration wherein the bus signal trace has a bus reference plane and dielectric substrate on one side only. As a result, the impedance continually increases with increasing dielectric thickness. For buses having this type of construction, the relationship between the dielectric thickness d1 and the impedance results in the impedance being difficult to maintain within a tightly controlled range without instituting expensive manufacturing and testing procedures.

Current six-layer PCBs have two pair of signal layers with a reference voltage plane between each pair of signal layers (i. e. signal-ref-signal-signal-ref-signal). As such, routing of a bus signal trace is currently provided on the outermost signal layers with a reference plane on only one side of the bus signal trace layer. As with a four-layer PCB, the use of only one reference voltage plane limits the ability to tightly control the impedance of the bus. The bus signal traces are typically not located on the inner signal layers as this would result in excessive cross-talk between the two busses.

U.S. Pat. No. 5,677,515 to Selk et al discloses a shielded printed wiring board which provides electrical and magnetic isolation for the signal layers located thereon. The printed wiring board includes a signal layer laminated between two non-conductive dielectric layers. The bottom side of the printed wiring board has a conductive layer coated thereon. Grooves are routed through the printed circuit board on both sides of each signal layer extending from the top layer partially through to the conductive layer. Conductive metallic coatings are then provided to coat the board and thereby encapsulate the signal layer in a ground envelope, separated by a controlled thickness dielectric. In an alternate embodiment, a plurality of layers are laminated one on top of the other to provide a multilayer printed wiring board. This reference does not disclose a circuit construction suitable for a memory module bus as disclosed herein. In particular, the signal layers and reference plane layers do not provide a suitable controlled impedance bus.

U.S. Pat. No. 5,278,524 to Mullen discloses a multilayered printed circuit board for mounting and interconnecting the terminals of multi-terminal electronic components. The circuit board mounts the electronic components one side of the circuit board and provides for interconnecting the terminals of the electronic components. A transmission line arrangement is configured from layers of the circuit board for distributing a signal with fast rise and fall times to electronic components mounted on the circuit board. The transmission line arrangement includes a narrow conductive strip surrounded by four constant voltage conductors spaced from the narrow conductive strip by dielectric material. The constant voltage conductors comprise a first planar conductive layer above the narrow conductive strip and spaced therefrom by one of the dielectric layers, a second planar conductive layer below the narrow conductive strip and spaced therefrom by the other dielectric layer, and a pair of coplanar conductive strips between the two layers of dielectric material and lying parallel to and coplanar with the narrow conductive strip, one on each side of the narrow conductive strip. The invention additionally encompasses a panel board embodiment in which the transmission line arrangement, including at least two constant voltage planes surrounding the narrow conductive strip, is embedded in the multi-layered board. This reference does not disclose a suitable six-layer PCB construction providing transmission line impedance characteristics for a bus as described herein. The PCB construction disclosed in this reference positions the bus signal traces on the signal layers of the PCB. Furthermore, the technique of using vias to interconnect the constant voltage conductors surrounding each signal trace is not disclosed.

U.S. Pat. No. 5,150,088 to Virga et al discloses stripline shielding structures for stripline conductors implemented in unitized multilayer circuit structures. The stripline structures generally include a lower ground plane below the stripline conductor, one or more embedded ground planes above the stripline conductor, and conductive elements laterally spaced from the stripline conductor for electrically connecting the ground planes. Resistive layers may be included above the embedded ground plane(s) for additional shielding. This reference does not disclose a circuit construction suitable for a memory module bus as disclosed herein. In particular, the signal layers and reference plane layers do not provide a suitable controlled impedance bus.

Accordingly, a need has arisen for a PCB construction and method of manufacture in which the shortcomings of the previous techniques are overcome. More particularly, a need has arisen for a cost-effective 6-layer PCB construction and method of manufacture that can provide the impedance level and tolerance required by high-performance memory modules such as the RAMBUS RIMM modules.

SUMMARY

One embodiment, accordingly, provides a multi-layer circuit substrate having an integral bus construction that reduces the sensitivity of the impedance to the dielectric thickness and relative position of the conductive layer including the bus signal trace. A multi-layer circuit substrate of this type has widespread utility as high speed interfaces for high performance memory in computers. To this end, a multi-layer circuit substrate for a computer system having an integral bus portion includes a dielectric substrate having a first device signal layer formed on a first side thereof and a second device signal layer formed on a second side thereof. The first and second device signal layers being are patterned to include at least one bus reference plane. A device reference plane layer is disposed between the first and second device signal layers in the dielectric substrate. The device reference plane layer is patterned to include a plurality of guard bands and a bus signal trace between at least two of the guard bands.

A principal advantage of this embodiment is that this type of PCB construction has been simulated to provide an impedance tolerance of 2.78 ohms using standard manufacturing processes. This construction technique can be used to produce PCB's having this tolerance without the use of 100% testing and with perhaps no special testing other than current testing procedures.

BRIEF DESCRIPTION OF THE DRAWING FIGURES

DETAILED DESCRIPTION

Figure 1A:
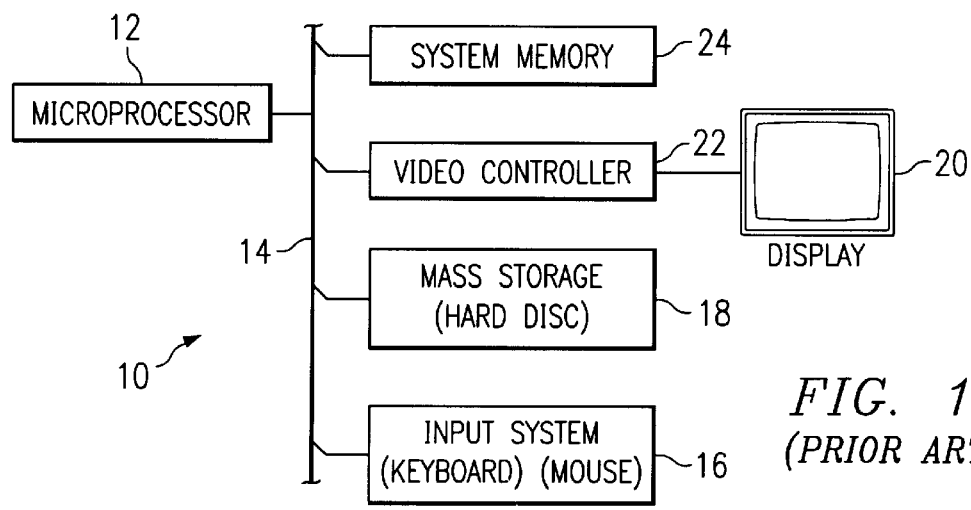
FIG. 1A is a block diagram of a typical computer system.

In one embodiment, FIG. 1A shows a block diagram of a computer system, indicated generally at 10. The computer system 10 includes a microprocessor 12 which is connected to a bus 14. Bus 14 serves as a connection between the microprocessor 12 and other components of the computer system 10. An input system 16 is coupled to the microprocessor 12 to provide input to the microprocessor 12. Examples of input devices include keyboards, touchscreens, and pointing devices such as mouses, trackballs, and trackpads. Programs and data are stored on a mass storage device 18 which is coupled to the microprocessor 12. Mass storage devices include such devices as hard disks, optical disks, magneto-optical drives, floppy drives, and the like. The computer system 10 further includes a display 20 which is coupled to the microprocessor 12 by a video controller 22. The system memory 24 provides the microprocessor 12 with fast storage to facilitate execution of computer programs by the microprocessor 12. It should be understood that other busses and intermediate circuits can be employed between the components described above and microprocessor 12 to facilitate interconnection between the components and the microprocessor.

Figure 1B:
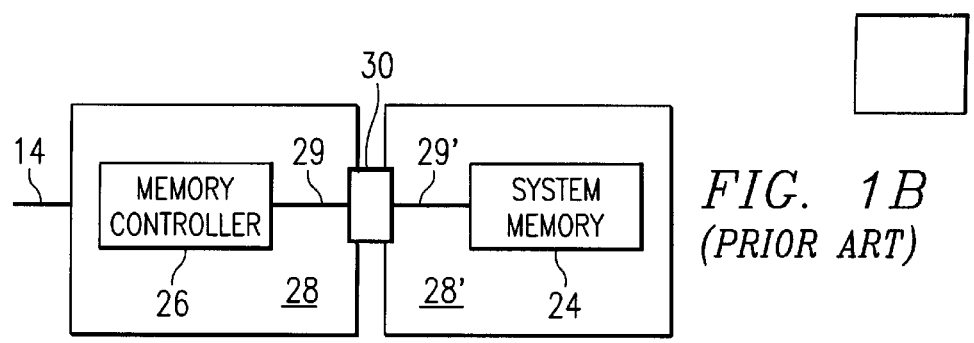
FIG. 1B is a block diagram of a system memory and memory controller coupled by a bus in a prior art computer system.

FIG. 1B illustrates a memory controller 26 on a first printed circuit board (hereinafter 'PCB') 28 coupled to a system memory 24 on a second PCB 28'. To accomplish the coupling of these devices, the first PCB 28 includes a controlled impedance bus 29 coupled through a memory connector 30 to a controlled impedance bus 29' on the second PCB 28'. It should be understood that in some computer systems, the system memory may reside on the same PCB as the memory controller and a bus according to the illustrative embodiment will be employed.

Figure 2A:
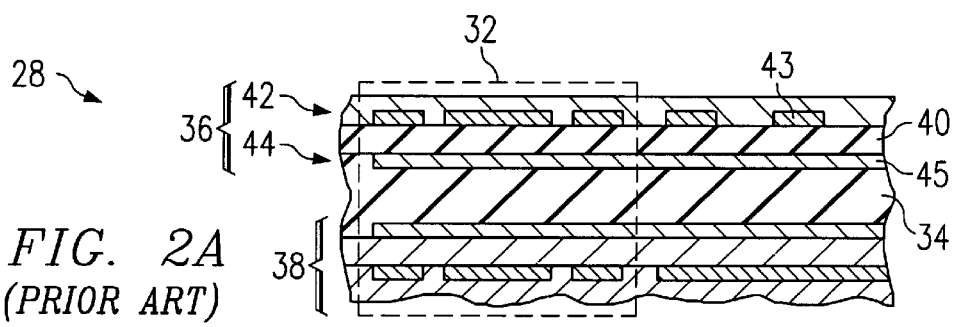
FIG. 2A is a cross-sectional view of a prior art 4-layer printed circuit board having a bus region with only one reference plane.
Figure 2B:
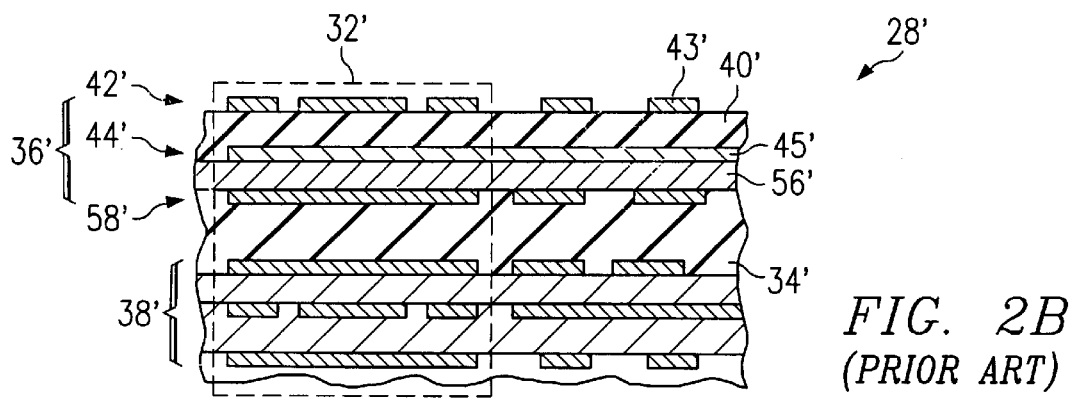
FIG. 2B is a cross-sectional view of a prior art 6-layer printed circuit board having a bus region with only one reference plane.
Figure 3:
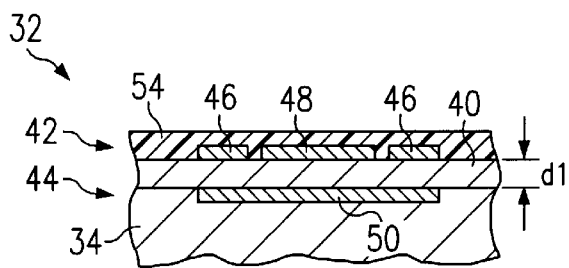
FIG. 3 is a fragmentary view of the bus portion of FIG. 2.

As shown in FIGS. 2A, 2B and 3, a 4-layer PCB and a 6-layer PCB, indicated generally at 28 and 28', respectively, are shown according to prior art construction techniques having a bus region 32 having a single reference plane and dielectric substrate configuration. The 4-layer PCBs 28 include two multi-layer circuit substrates (36,38) with a dielectric filler 34 disposed between them. As shown, each of the multi-layer circuit substrates (36,38) include a first dielectric substrate 40 having a thickness of d1 with a first device signal trace layer 42 on one side and a device reference plane layer 44 on the opposing side.

For the 4-layer PCB 28, the device signal traces 43 are carried on the first device signal trace layer 42 and the device reference plane 45 is carried on the device reference plane layer 44. The device signal trace layer 42 further includes at least two guard bands 46 with a bus signal trace 48 disposed between them. For the 6-layer PCB 28' shown in FIG. 2B, the construction is the same as for a four-layer PCB 28 except for a second device signal trace layer 58' and second dielectric substrate 56' that is provided between the dielectric filler 34' and each device reference plane layer 44'. Consequently, 4-layer and 6-layer PCBs according to prior art construction techniques do not provide a reference voltage plane on both sides of the bus signal trace. As shown in FIG. 2A, solder mask 54 may be used over the first device signal trace layer 42 to protect against adverse environmental conditions and to control the flow of solder during a solder reflow process.

Figure 4:
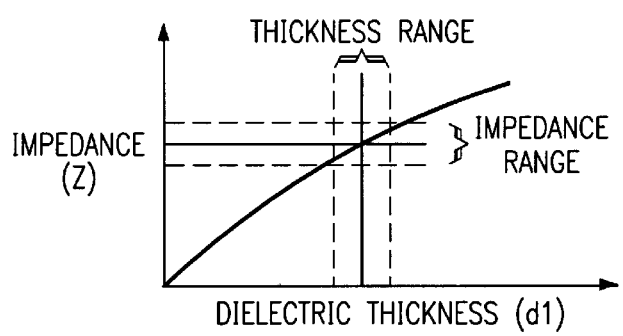
FIG. 4 is a graphical diagram showing the relationship of dielectric thickness, bus signal trace placement and the bus impedance according to the bus shown in FIG. 2.

FIG. 4 illustrates the general relationship between the impedance of the bus and the dielectric thickness d1 for a bus according to the prior art construction techniques, as shown in FIGS. 2 and 3. The impedance continually increases with increasing dielectric thickness d1. Over a narrowly defined range of dielectric thickness d1 typically used for bus constructions, the impedance for a bus according to prior art construction techniques increases nearly linearly with increasing dielectric thickness. The relationship between the dielectric thickness d1 and the bus impedance according to prior art bus construction techniques results in the impedance being difficult to maintain within a tightly controlled range without instituting expensive manufacturing and testing procedures.

Figure 5:
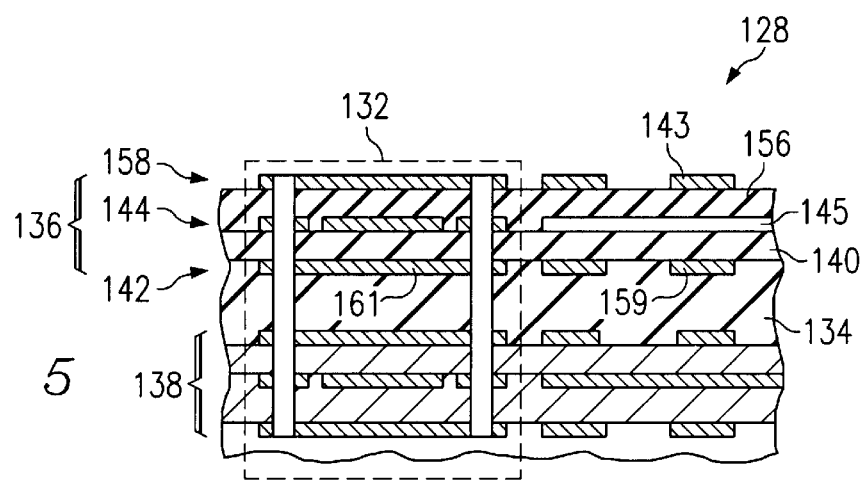
FIG. 5 is a cross-sectional view of an illustrative embodiment of a controlled impedance bus.
Figure 6A:
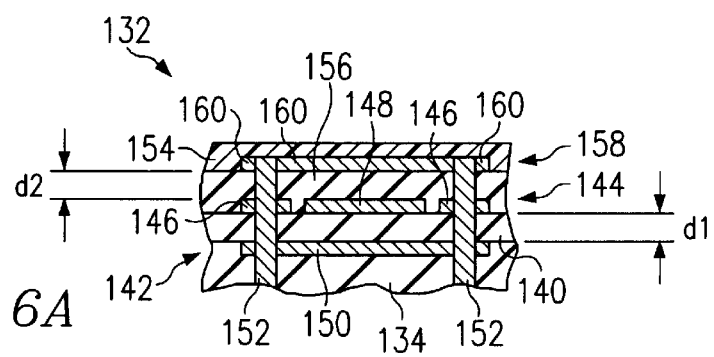
FIG. 6A is a fragmentary view of the bus portion of FIG. 2.
Figure 6B:
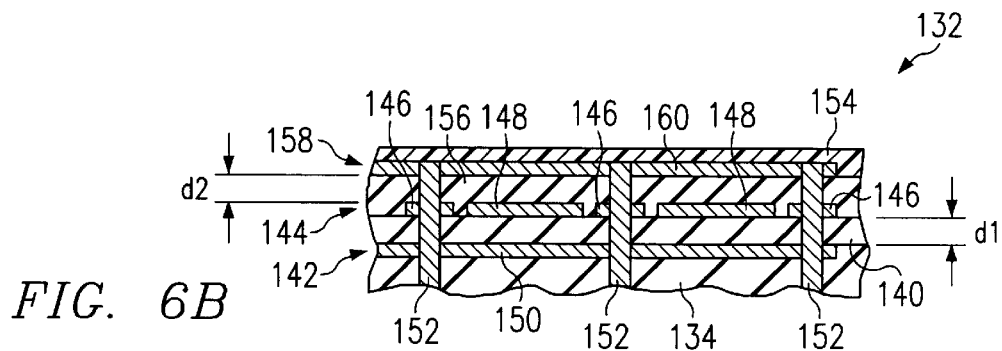
FIG. 6B is a fragmentary view of an alternate illustrative embodiment of the bus portion of FIG. 2.

Referring to FIGS. 5, 6A and 6B, a PCB, indicated generally at 128, according to an illustrative embodiment of the disclosure has a bus region 132. The PCB 128 is of a 6-layer construction having two multi-layer circuit substrates (136,138) with a dielectric filler 134 disposed between them. As shown, the two multi-layer circuit substrates (136,138) each include a first dielectric substrate 140 having a thickness of d1 with a first device signal trace layer 142 on one side and a device reference plane layer 144 on the opposing side. A second dielectric substrate 156 is formed on the device reference plane layer 144 and a second device signal trace layer 158 is formed on the side of the second dielectric substrate 156 opposing the device reference plane layer 144. The second dielectric substrate 156 preferably has a thickness whereby the distance d2 is approximately the same as the distance d1.

The device reference plane layer 144 is patterned to include at least one device reference plane 143, at least two guard bands 146, and a bus signal trace 148 formed between at least two of the guard bands 146. The first device signal trace layer 142 is patterned to include a first bus reference plane 150 and at least one device signal trace 145. The second device signal trace layer 158 is patterned to include a second bus reference plane 160 and at least one device signal trace 159. The first bus reference plane 150 and second bus reference plane 160 are coupled to at least one of the guard bands 146. One technique for coupling the guard bands 146 to the first bus reference plane 150 is by using one or more conductive vias 152. A solder mask 154 may be used over the third conductive layer 158 to protect against adverse environmental conditions and to control the flow of solder during solder reflow processes. FIG. 6B illustrates an embodiment of a bus wherein a plurality of bus signal traces 148 are positioned between a plurality of guard bands 146.

Depending on the construction of the PCB, the device signal layer 142 may be patterned to include device signal traces 159, a reference voltage plane 161 (i.e. VCC or GND) or both. The types of devices typically coupled to the non-bus portions of the device signal layers 142, 144, 158 typically include clocks, resistors, capacitors, diodes, and other required components.

Unlike prior art constructions, the PCB construction technique disclosed herein positions each bus signal trace 148, guard band 146 and device reference plane 143 on the same conductive layer. To provide the required shielding, the bus reference planes 150, 160 are carried on the same conductive layers as the respective device signal traces 145, 159. The inverted orientation of the bus signal trace(s) and bus reference planes relative to the device signal traces 145, 159 and to the device reference plane 143 represents a significant departure from prior art PCB constructions. By inverting the location of these elements, each bus signal trace 148 is provided between a pair of bus reference planes 150, 160.

As an example of a construction according to the illustrative embodiment, a 6-layer PCB as shown in FIGS. 5, 6A and 6B may include a bus region having one or more buses constructed to provide a nominal impedance of 28 ohms. The first and second dielectric substrates 140, 156 are 4.5 mil thick fully cured epoxy resin (hereinafter referred to as FR-4) having a copper foil laminated thereto. Each bus signal trace 148 has a width of 9 mils. Each guard band 146 has a width of 10 mils and the spacing between each bus signal trace 148 and each adjacent guard band 146 is 4.5 mils. This type of construction has been simulated to yield a nominal impedance of 28 ohms with a board-to-board variation of +/−2.78 ohms.

Figure 7:
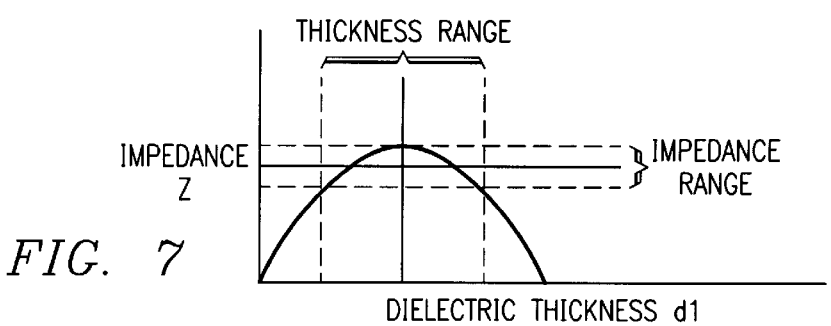
FIG. 7 is a graphical diagram showing the relationship of dielectric thickness, bus signal trace placement and the bus impedance according to the illustrative embodiment of FIG. 5.

FIG. 7 illustrates the general relationship between the impedance of the bus and the dielectric thickness d1 for a bus according to an illustrative embodiment of the disclosure herein. This graph illustrates that when the distance between the bus reference planes is held constant, the impedance is constrained at or below a maximum acceptable impedance value as the first device signal trace layer 142 is moved away from an equidistant position between the bus reference planes 150,160. Effectively, the addition of the second bus reference plane 160 acts to make impedance less sensitive to positioning of the guard bands 146 and bus signal trace 148 relative to the bus reference planes 150, 160. This is an important advantage for the construction technique of the illustrative embodiments as it relaxes the dimensional tolerances of the PCB construction needed to achieve a desired impedance level. The construction technique of the illustrative embodiments contributes to enabling buses having tightly controlled impedance levels to be manufactured more cost effectively.

Without wanting to be constrained by theory, it is believed that the addition of the second dielectric substrate and second bus reference plane also increases the effective dielectric constant of the bus. The dielectric constant of FR-4 is approximately 4.3 and the dielectric constant for air is 1.0. In prior art bus constructions wherein only one dielectric substrate and bus reference plane are used (FIG. 3) and wherein the dielectric substrate is FR-4, the effective dielectric constant associated with the bus signal trace is approximately 3.0. A dielectric constant of 3.0 is roughly the average of the dielectric constants of FR-4 and air. However, for bus constructions according to the illustrative embodiments wherein the bus signal trace is positioned between two dielectric substrates (FIG. 6) and the dielectric substrate is FR-4, the effective dielectric constant is approximately 4.3; the dielectric constant of FR-4. This increase in the effective dielectric constant contributes to the reduction in impedance sensitivity to physical tolerances.

Figure 8:
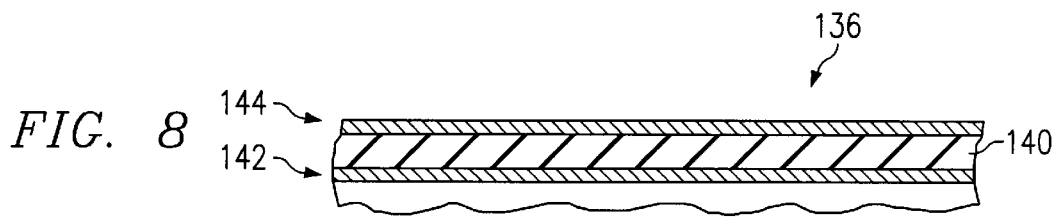
FIGS. 8 through 15 are cross-sectional views showing a process for fabricating a bus according to the illustrative embodiments.

FIGS. 8 to 15 illustrate a typical manufacturing process for fabricating a bus according to the illustrative embodiment shown in FIGS. 5 and 6. This method of manufacturing a bus, as well as others, may be used in a stand-alone capacity or in conjunction with the manufacturing processes for making printed circuit boards. A first dielectric substrate 140 having first and second conductive layers 142, 144 on opposing sides is provided. There are several commercial sources of supply for conductor clad dielectric substrate commonly referred to as "cores". These cores are typically a fully cured FR-4 material with a copper foil laminated thereto prior to curing the FR-4 material. As commonly practiced in the manufacture of PCB's, FR-4 is cured between two sheets of copper foil to produce a conductor-clad dielectric substrate as shown in FIG. 8.

Figure 9:
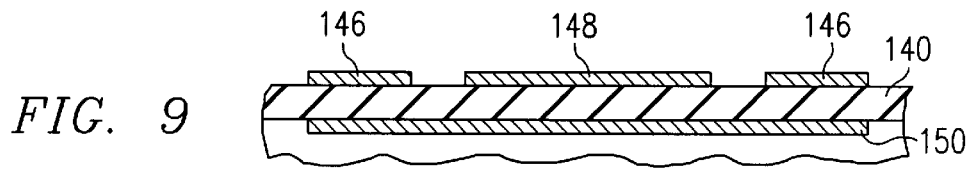
Figure 10:
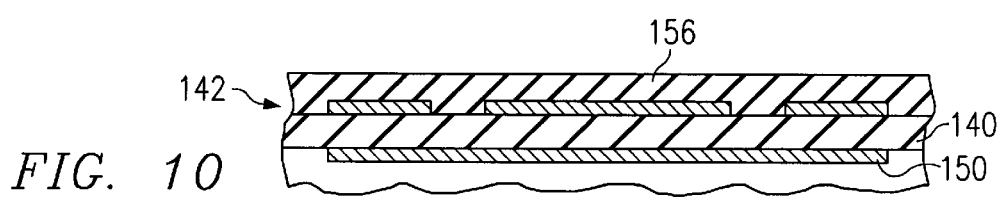
Figure 11:
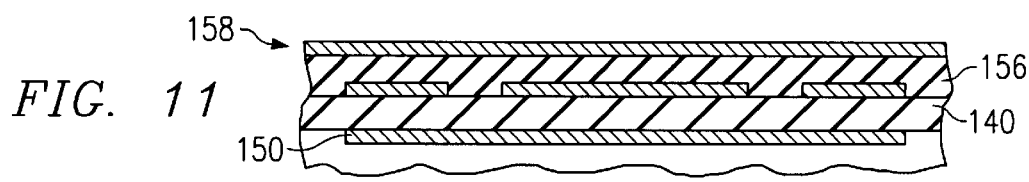
Figure 12:
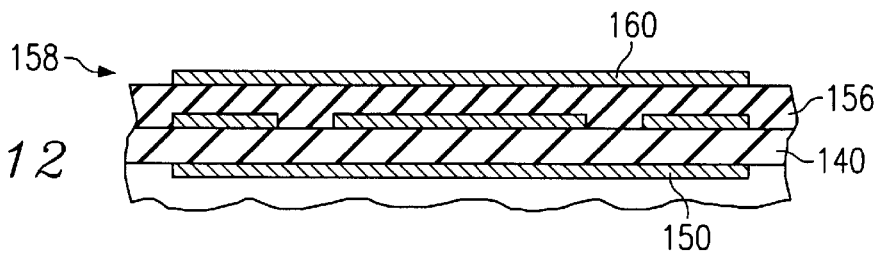

As shown in FIG. 9, the first device signal trace layer 142 is patterned by a method such as etching to form at least one bus reference plane 150 and at least one device signal trace 145 (shown in FIG. 5). The device reference plane layer 144 is similarly patterned to include device reference plane 143 (shown in FIG. 5), at least two guard bands 146 with a bus signal trace 148 disposed between at least two of the guard bands 146. A second dielectric substrate 156 is subsequently formed over the device reference plane layer 144 and then a second device signal trace layer 158 is formed on the second dielectric substrate 156 (FIGS. 10 and 11). The second dielectric substrate 156 is typically a partially cured FR-4 material (commonly referred to as a prepreg) that is laminated over the first device signal trace layer 142. The second device signal trace layer 158 is typically a copper foil that is subsequently laminated to the second dielectric substrate 156. In the case where the second dielectric substrate 156 is a partially cured FR-4 material, it must be cured under heat and pressure following the second device signal trace layer 158 being laminated to it. As shown in FIG. 12, the second device signal trace layer 158 is then patterned to form a second bus reference plane 160 and at least one device signal trace 159 (shown in FIG. 5).

Figure 13:
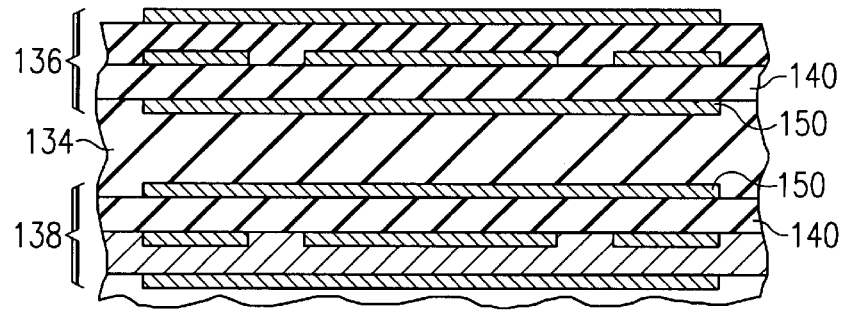

As shown in FIG. 13, a dielectric filler 134 is formed between a first and second multi-layer circuit substrates 136, 138 made according to the steps illustrated in FIGS. 8 to 12. The dielectric filler 134 will typically be a partially cured FR-4 material that needs to be fully cured under heat and pressure after the two multi-layer circuit substrates 136,138 are laminated between it.

Figure 14:
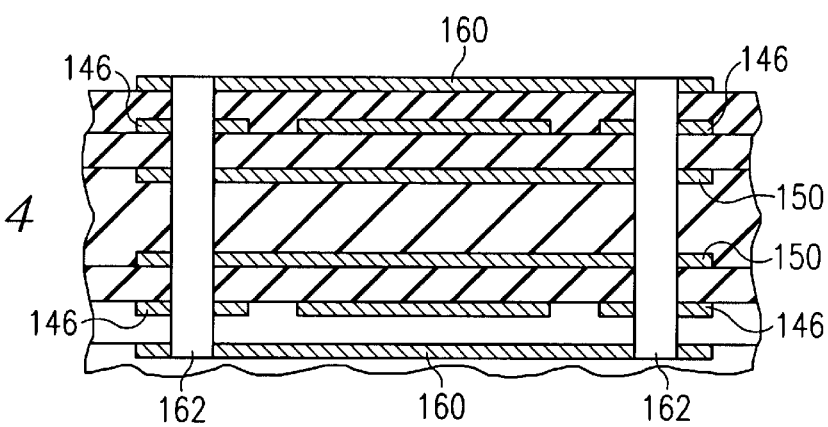
Figure 15:
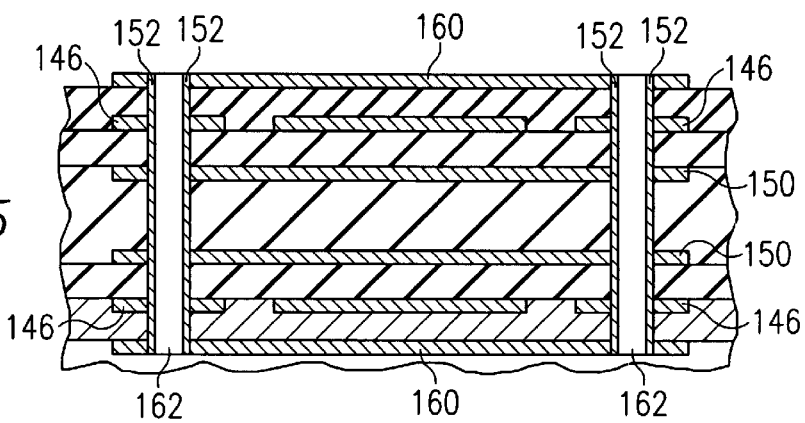

Referring to FIGS. 14 and 15, the guard bands 146 are electrically coupled to the first and second bus reference planes 150,160 by forming through holes 162. The through holes 162 may be formed by mechanical drilling, punching, laser drilling or other known techniques. Conductive vias 152 may them be formed by plating the interior surfaces of the through holes using any number of known plating process.

As evident to one skilled in the art, it should be understood that there are several techniques for making a PCB having a bus portion according to the illustrative example. The process steps shown in FIGS. 8 to 15 represent merely one of many possible methods for making a bus portion according to the illustrative example. Furthermore, a bus according to the illustrative embodiment may be incorporated in other types of PCB constructions (i.e., 10-layer PCB's, etc).

In operation, the embodiments disclosed herein place the bus signal trace between two dielectric substrates and bus reference planes. This type of construction results in the fields associated with signal transmissions over the bus signal trace or traces to be more tightly constrained. By better constraining the fields, the impedance of the bus is reduced and can be more highly controlled within a given range.

As a result, one embodiment provides a multi-layer circuit substrate for a computer system having an integral bus portion including a dielectric substrate having a first device signal layer formed on a first side thereof and a second device signal layer formed on a second side thereof. The first and second device signal layers are each patterned to include at least one bus reference plane. A device reference plane layer is disposed between the first and second device signal layers in the dielectric substrate. The device reference plane layer is patterned to include a plurality of guard bands and a bus signal trace between at least two of the guard bands.

Another embodiment provides a printed circuit board having a dielectric filler with a first multi-layer circuit substrate disposed on a first side thereof and a second multi-layer circuit substrate disposed on a second side thereof. The first and second multi-layer circuit substrates are substantially parallel to each other. The first and second multi-layer circuit substrates include a dielectric substrate having a first device signal layer formed on a first side thereof and a second device signal layer formed on a second side thereof. The first and second device signal layers are each patterned to include at least one bus reference plane. A device reference plane layer is disposed between the first and second device signal layers in the dielectric substrate. The device reference plane layer is patterned to include a plurality of guard bands and a bus signal trace between at least two of the guard bands.

Still another embodiment provides a computer system including a microprocessor mounted on a first printed circuit board; an input coupled to provide input to the microprocessor; a mass storage coupled to the microprocessor; a display coupled to the microprocessor by video controller; a memory coupled to provide storage to facilitate execution of computer programs by the microprocessor with the memory mounted on a second printed circuit board; and a bus coupled to the memory. The first printed circuit board has a dielectric filler with a first multi-layer circuit substrate disposed on a first side and a second multi-layer circuit substrate disposed on a second side thereof. The first and second multi-layer circuit substrates are substantially parallel to each other. Each of the multi-layer circuit substrates include a dielectric substrate having a first device signal layer formed on a first side thereof and a second device signal layer formed on a second side thereof. The first and second device signal layers are each patterned to include at least one bus reference plane. A device reference plane layer is disposed between the first and second device signal layers in the dielectric substrate. The device reference plane layer is patterned to include a plurality of guard bands and a bus signal trace between at least two of the guard bands.

A yet further embodiment provides a method of making a bus. This method includes the steps of providing a dielectric substrate having a first device signal layer on a first side thereof and a device reference plane layer on a second side thereof; patterning the first device signal layer to include at least one signal trace and at least one bus reference plane; patterning the device reference plane layer to include a plurality of guard bands and a bus signal trace between at least two of the guard bands; forming a second dielectric substrate on the device reference plane layer; forming a second device signal trace layer on the second dielectric substrate on a side opposite the device reference plane layer; and patterning the second device trace layer to include at least one bus reference plane.

As it can be seen, the principal advantages of these embodiments are that a bus having highly controlled impedance may be provided. By providing a bus with highly controlled impedance, increased signal transmission rates over these types of busses are possible with less noise attributed to impedance mis-match between the bus and the components sending and receiving the signals. Furthermore, utilizing a bus construction technique that reduces the sensitivity of the impedance to the dielectric thickness and placement of the bus signal trace allows for tighter impedance values without the need for instituting expensive manufacturing and testing procedures.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A plurality of multi-layer circuit substrates for a computer system having an integral bus portion comprising:
   a dielectric filler between each circuit substrate;
   each circuit substrate including:
      a first dielectric substrate;
      a first device signal trace layer including a first bus reference plane on one side of the first dielectric substrate; and
      a device reference plane layer on another side of the first dielectric substrate opposite the one side;
      a second dielectric substrate formed on the device reference planer layer;
      a second device signal trace layer including a second bus reference plane formed on a side of the second dielectric substrate opposite the device reference plane layer; and
      the device reference plane layer being patterned to include at least one device reference plane, at least two guard bands, and a bus signal trace formed between the guard bands.

2. The multi-layer circuit substrate of claim 1 further including means for electrically coupling each of the bus reference planes to at least one of the guard bands.

3. The multi-layer circuit substance of claim 2 further including a plurality of conductive vias extending through the guard bands and bus reference planes.

4. The multi-layer circuit substrate of claim 1 wherein the first and second dielectric substrates have a dielectric constant of from about 4.0 to about 4.5.

5. The multi-layer circuit substrate of claim 1 wherein the bus reference planes are spaced apart from each other by a distance of about 9 mils.

6. The multi-layer circuit substrate of claim 1 wherein the bus signal trace is spaced approximately equidistantly from each of the adjacent bus reference planes.

7. The multi-layer circuit substrate of claim 1 wherein the bus has an impedance of from about 25 ohms to about 31 ohms.

8. The multi-layer circuit substrate of claim 1 wherein at least one of the device signal trace layers is patterned to include at least one device signal trace.

9. The multi-layer circuit substrate of claim 1 wherein one of the device signal trace layers is patterned to include at least one device signal trace and the other device signal trace layer is patterned to include at least one reference voltage plane.

10. A printed circuit comprising:
    a pair of multi-layer circuit substrates;
    a dielectric filler between each circuit substrate;
    each circuit substrate including:
       a first dielectric substrate;
       a first device signal trace layer including a first bus reference plane on one side of the first dielectric substrate; and
       a device reference plane layer on another side of the first dielectric substrate opposite the one side;
    a second dielectric substrate formed on the device reference plane layer;
    a second device signal trace layer including a second bus reference plane formed on a side of the second dielectric substrate opposite the device reference plane layer; and
    the device reference plane layer being patterned to include at least one device reference plane, at least two guard bands, and a bus signal trace formed between the guard bands.

11. The printed circuit board of claim 10 further including means for electrically coupling each of the bus reference planes to at least one of the guard bands.

12. The printed circuit board of claim 11 further including a plurality of conductive vias extending through the guard bands and bus reference planes.

13. The printed circuit board of claim 10 wherein the first and second dielectric substrates have a dielectric constant of from about 4.0 to about 4.5.

14. The printed circuit board of claim 10 wherein the bus reference planes are spaced apart from each other by a distance of about 9 mils.

15. The printed circuit board of claim 10 wherein the bus signal trace is spaced approximately equidistantly from each of the adjacent bus reference planes.

16. The printed circuit board of claim 10 wherein the bus has an impedance of from about 25 ohms to about 31 ohms.

17. The printed circuit board of claim 10 wherein at least one of the device signal trace layers is patterned to include at least one device signal trace.

18. The printed circuit board of claim 10 wherein one of the device signal trace layers is patterned to include at least one device signal trace and the other device signal trace layer is patterned to include at least one reference voltage plane.

19. A computer system, comprising:
    a microprocessor mounted on a first printed circuit substrate;
    an input coupled to provide input to the microprocessor;
    a mass storage coupled to the microprocessor;
    a video controller coupled to the microprocessor;
    a memory coupled to provide storage to facilitate execution of computer programs by the microprocessor, the memory mounted on a second printed circuit substrate; and
    a bus coupled to the memory;
    a dielectric filler between the first circuit substrate and the second circuit substrate;
    each circuit substrate including:
       a first dielectric substrate;
       a first device signal trace layer including a first bus reference plane on one side of the first dielectric substrate; and
       a device reference plane layer on another side of the first dielectric substrate opposite the one side;
    a second dielectric substrate formed on the device reference plane layer;
    a second device signal trace layer including a second bus reference plane formed on a side of the second dielectric substrate opposite the device reference plane layer; and
    the device reference plane layer being patterned to include at least one device reference plane, at least two guard bands, and a bus signal trace formed between the guard bands.

20. The computer system of claim 19 wherein the bus includes a first portion on the first printed circuit substrate and a second portion on the second printed circuit substrate the first and second portions of the bus being electrically connected by a connector.

21. The computer system of claim 19 further including means for electrically coupling each of the bus reference planes to at least one of the guard bands.

22. The computer system of claim 21 further including a plurality of conductive vias extending through the guard bands and bus reference planes.

23. The computer system of claim 19 wherein the first and second dielectric substrates have a dielectric constant of from about 4.0 to about 4.5.

24. The computer system of claim 19 wherein the bus reference planes are spaced apart from each other by a distance of about 9 mils.

25. The computer system of claim 19 wherein the bus signal trace is spaced approximately equidistantly from each of the adjacent bus reference planes.

26. The computer system of claim 19 wherein the bus has an impedance of from about 25 ohms to about 31 ohms.

27. The computer system of claim 19 wherein at least one of the device signal trace layers is patterned to include at least one device signal trace.

28. The computer system of claim 19 wherein one of the device signal trace layers is patterned to include at least one device signal trace and the other device signal trace layer is patterned to include at least one reference voltage plane.

29. A method of making a multi-layer circuit substrate comprising:

provididing a dielectric substrate having a first device signal layer on a first side thereof and a device reference plane layer on a second side thereof;

patterning the first device signal layer to include at least one bus reference plane;

patterning the device reference plane layer to include a plurality of guard bands and a bus signal trace between at least two of the guard bands;

forming a second dielectric substrate on the device reference plane layer;

forming a second device signal trace layer on the second dielectric substrate on a side opposite the device reference plane layer; and patterning the second device signal trace layer to include at least one bus reference plane.

30. The method of claim 29 further including the step of forming means for electrically coupling each of the bus reference planes to at least one of the guard bands.

31. The method of claim 29 wherein the means for electrically coupling includes a plurality of conductive vias extending through the guard bands and bus reference planes.

32. The method of claim 29 wherein at least one of the device signal trace layers is patterned to include at least one device signal trace.

33. The method of claim 29 wherein one of the device signal trace layers is patterned to include at least one device signal trace and the other device signal trace layer is patterned to include at least one reference voltage plane.

* * * * *

UNITED STATES PATENT AND TRADEMARK OFFICE
CERTIFICATE OF CORRECTION

PATENT NO.    : 6,236,572 B1
DATED         : May 22, 2001
INVENTOR(S)   : Abeye Teshome and Douglas Elmer Wallace, Jr.

It is certified that error appears in the above-identified patent and that said Letters Patent is hereby corrected as shown below:

<u>Column 1,</u>
Lines 48-49, please delete the word "Modules" and insert therefor -- modules --.

<u>Column 3,</u>
Line 43, please delete the word "typical".

<u>Column 11, line 19 through Column 12,</u>
Please delete claims 29-33.

Signed and Sealed this

Fifteenth Day of April, 2003

JAMES E. ROGAN
*Director of the United States Patent and Trademark Office*